United States Patent
Broadway et al.

(10) Patent No.: US 8,445,373 B2
(45) Date of Patent: May 21, 2013

(54) METHOD OF ENHANCING THE CONDUCTIVE AND OPTICAL PROPERTIES OF DEPOSITED INDIUM TIN OXIDE (ITO) THIN FILMS

(75) Inventors: David M. Broadway, Northville, MI (US); Yiwei Lu, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 358 days.

(21) Appl. No.: 12/457,006

(22) Filed: May 28, 2009

(65) Prior Publication Data

US 2010/0304523 A1 Dec. 2, 2010

(51) Int. Cl.
*H01L 21/44* (2006.01)

(52) U.S. Cl.
USPC ............... 438/608; 438/609; 257/E33.064

(58) Field of Classification Search
USPC .................. 438/608, 609; 257/E33.064
See application file for complete search history.

(56) References Cited

U.S. PATENT DOCUMENTS

| | | | | |
|---|---|---|---|---|
| 5,916,375 | A * | 6/1999 | Agui et al. | 136/258 |
| 6,123,824 | A | 9/2000 | Sano et al. | 205/124 |
| 6,288,325 | B1 | 9/2001 | Jansen et al. | 136/249 |
| 6,613,603 | B1 | 9/2003 | Sano | 438/72 |
| 6,784,361 | B2 | 8/2004 | Carlson et al. | 136/258 |
| 2008/0169021 | A1 | 7/2008 | Krasnov | 136/256 |
| 2008/0308147 | A1 | 12/2008 | Lu et al. | 136/256 |
| 2009/0020157 | A1 | 1/2009 | Krasnov et al. | 136/256 |
| 2009/0032098 | A1 | 2/2009 | Lu | 136/257 |
| 2009/0084438 | A1 | 4/2009 | den Boer et al. | 136/256 |

FOREIGN PATENT DOCUMENTS

EP 1 347 468 9/2003

OTHER PUBLICATIONS

Morgan et al., Annealing effects on opto-electronic properties of sputtered and thermally evaporated indium-tin-oxide films, 1998, Thin Solid Films, 312, p. 268-272.*
U.S. Appl. No. 12/285,374, of den Boer et al., filed Oct. 2, 2008.
U.S. Appl. No. 12/258,890, of Thomsen et al., filed Oct. 15, 2008.

* cited by examiner

*Primary Examiner* — Robert Huber
(74) *Attorney, Agent, or Firm* — Nixon & Vanderhye P.C.

(57) ABSTRACT

Certain example embodiments of this invention relate to a method of activating an indium tin oxide (ITO) thin film deposited, directly or indirectly, on a substrate. The ITO thin film is baked in a low oxygen environment at a temperature of at least 450 degrees C. for at least 10 minutes so as to provide for (1) a post-baked resistivity of the ITO thin film that is below a resistivity of a corresponding air-baked ITO thin film, (2) a post-baked visible spectrum absorption and transmission of the ITO thin film that respectively are below and above the absorption and transmission of the corresponding air-baked ITO thin film, and (3) a post-baked infrared reflectivity of the ITO thin film that is above the reflectivity of the corresponding air-baked ITO thin film. The substrate with the activated ITO thin film may be used in a photovoltaic device, for example.

19 Claims, 3 Drawing Sheets

METHOD OF ENHANCING THE CONDUCTIVE AND OPTICAL PROPERTIES OF DEPOSITED INDIUM TIN OXIDE (ITO) THIN FILMS

FIELD OF THE INVENTION

Certain example embodiments of this invention relate to processes for improving the conductive and optical properties of indium tin oxide (ITO or InSnOx) thin films. More particularly, certain example embodiments of this invention relate to processes for reducing the sheet resistance of ITO thin films by baking a sample in a low oxygen or vacuum environment at an elevated temperature.

BACKGROUND AND SUMMARY OF EXAMPLE EMBODIMENTS OF THE INVENTION

Photovoltaic devices are known in the art (e.g., see U.S. Pat. Nos. 6,784,361, 6,288,325, 6,613,603 and 6,123,824, the disclosures of which are hereby incorporated herein by reference). Amorphous silicon (a-Si) and CdTe type photovoltaic devices, for example, each include a front contact or electrode.

Pyrolitic $SnO_2$:F transparent conductive oxide (TCO) is often used as a front transparent electrode in photovoltaic devices. One advantage of pyrolitic $SnO_2$:F for use as a TCO front electrode in photovoltaic devices is that it is able to withstand high processing temperatures used in making the devices. However, from the viewpoint of uniformity, potential cost savings, and film smoothness, pyrolytically deposited TCOs are not desirable. Thus, it will be appreciated that a sputter-deposited TCO for use as an electrode in a photovoltaic device would be more desirable with respect to one or more of uniformity, cost savings and/or film smoothness.

In certain example instances, it is possible for the front electrode of a photovoltaic device to be made of a transparent conductive oxide (TCO) such as tin oxide, zinc oxide (possibly doped with Al, i.e., $ZnAlO_x$), or indium-tin-oxide (ITO) formed via sputtering on a substrate such as a glass substrate. However, in certain applications, such as CdTe photovoltaic devices as an example, high processing temperatures (e.g., 550-600 degrees C.) are used during manufacturing. High processing temperatures (e.g., 220-300 degrees C. or higher, with an example being about 250 degrees C.) may also be used in making a-Si and/or micromorph solar cells.

Unfortunately, conductive sputter-deposited TCOs such as $ZnAlO_x$ and ITO formed in a conventional sputtering process tends to lose significant amounts of electrical conductivity when heated to high temperatures (high temperatures may be needed in photovoltaic device manufacturing in certain instances). This loss of conductivity may be caused by fast oxygen migration from grain boundaries into the bulk of the crystallites. Moreover, at extremely high temperatures (e.g., 625-650 degrees C.), structural transformation of zinc oxide starts to occur.

Thus, it will be appreciated that there is a need in the art for techniques for making or forming a TCO electrode in a manner that improves the TCO's electrical conductivity as deposited and/or after high temperature processing.

It is known that lower sheet resistance in ITO films in comparison to its as-deposited counterpart typically requires activation. The activation, in turn, typically is achieved by baking in air in the temperature range of 300-350 degrees C. for 30-120 minutes. The inventors of the instant invention, however, have discovered that baking ITO films in a low oxygen environment such as a vacuum can further reduce the resistivity in comparison to air baked samples. Surprisingly and unexpectedly, the reduction in resistivity has been as much as 40% in certain example embodiments, when the deposited ITO thin film is baked in a vacuum or other low oxygen environment at a temperature elevated above the conventional activation temperature. For example, the inventors of the instant application surprising and unexpectedly have discovered that a significant reduction in resistivity may be achieved by baking a sample in a low oxygen or vacuum environment at a temperature of at least about 425 degrees C., more preferably at least about 450 degrees C., still more preferably at least about 475 degrees C., and most preferably at least about 500 degrees C. This activation technique of certain example embodiments also surprisingly and unexpectedly improves the optical properties of the activated ITO thin film.

Certain example embodiments of this invention relate to a method of activating an indium tin oxide (ITO) thin film deposited, directly or indirectly, on a substrate. The ITO thin film is baked in a low oxygen environment at a temperature of at least 450 degrees C. for at least 10 minutes so as to provide for (1) a post-baked resistivity of the ITO thin film that is below a resistivity of a corresponding air-baked ITO thin film, (2) a post-baked visible spectrum absorption and transmission of the ITO thin film that respectively are below and above the absorption and transmission of the corresponding air-baked ITO thin film, and (3) a post-baked infrared reflectivity of the ITO thin film that is above the reflectivity of the corresponding air-baked ITO thin film.

Certain example embodiments of this invention relate to a method of making a photovoltaic device. A substantially transparent substrate is provided. A layer comprising indium tin oxide (ITO) is disposed, directly or indirectly, on the substrate. The layer comprising ITO is heated in a low oxygen environment to a temperature of at least 475 degrees C. for at least 10 minutes so as to provide for (1) a post-baked sheet resistance of the layer comprising ITO that is below a sheet resistance of a corresponding air-baked ITO thin film, (2) a post-baked visible spectrum absorption and transmission of the layer comprising ITO that respectively are below and above the absorption and transmission of the corresponding air-baked ITO thin film, and (3) a post-baked infrared reflectivity of the layer comprising ITO that is above the reflectivity of the corresponding air-baked ITO thin film.

Certain example embodiments of this invention relate to a method of making an electronic device. A substrate having a layer comprising indium tin oxide (ITO) formed, directly or indirectly, thereon is provided. The layer comprising ITO is heated in a low oxygen environment to a temperature of at least 475 degrees C. for no more than 60 minutes to activate the layer comprising ITO, such that the layer comprising ITO has a sheet resistance lower than a sheet resistance of a corresponding layer comprising ITO activated in air-inclusive environment at a temperature no greater than 350 degrees C. The substrate is built into the electronic device.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
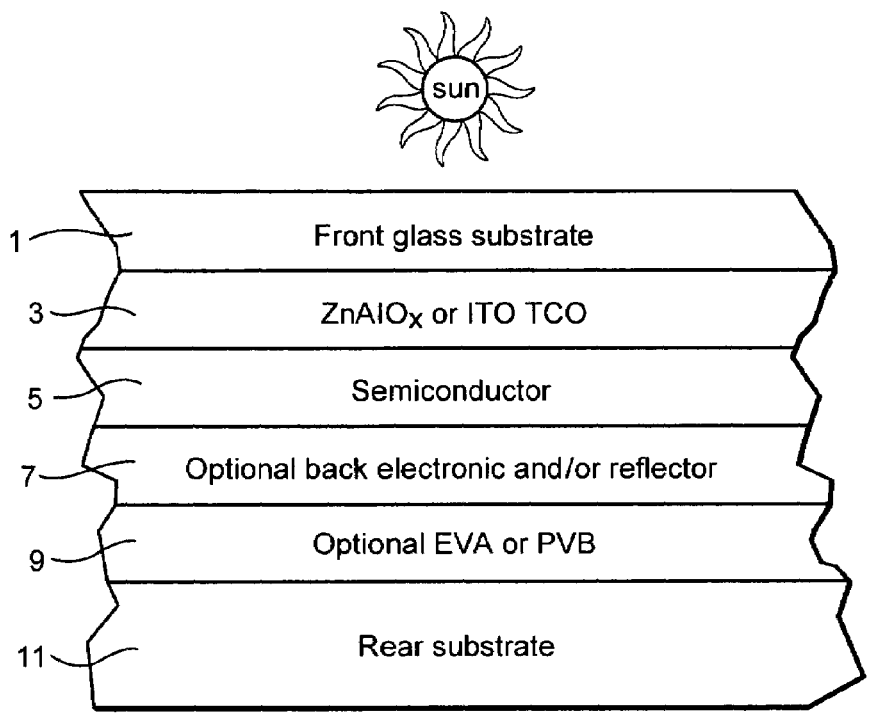
FIG. 1 is a cross-sectional view of an example photovoltaic device according to an example embodiment.

Photovoltaic devices such as solar cells convert solar radiation and other light into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, or any other suitable semiconductor material) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers which make up a semiconductor film. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, tandem thin-film solar cells, and the like.

Certain example embodiments of this invention may also be applicable to CdS/CdTe type photovoltaic devices, especially given the high processing temperatures often utilized in making CdTe type photovoltaic devices. Moreover, TCO electrodes according to different embodiments of this invention may also be used in connection with CIS/CIGS and/or tandem a-Si type photovoltaic devices. Additionally, although certain example embodiments are described in connection with front electrode photovoltaic devices, the example techniques described herein may be used in connection with back electrode photovoltaic devices. For example, the certain example embodiments used herein may be used in connection with the photovoltaic devices described in, for example, U.S. Publication Nos. 2008/0169021; 2009/0032098; 2008/0308147; and 2009/0020157; and application Ser. Nos. 12/285,374 and 12/285,890 (the disclosures of which are each incorporated herein by reference). Furthermore, as alluded to above, the example techniques described herein may be applied to other electronic devices that involve an ITO-coated substrate.

Referring now more particularly to the drawings in which like reference numerals indicate like parts throughout the several views, FIG. 1 is a cross sectional view of a photovoltaic device according to an example embodiment of this invention. The photovoltaic device includes transparent front substrate 1 of glass or the like, front electrode or contact 3 which is of or includes a TCO such as indium tin oxide (ITO) ($ZnO_x$ and/or $ZnAlO_x$ also may be used in different embodiments of this invention), active semiconductor film 5 of one or more semiconductor layers, optional back electrode or contact 7 which may be of a TCO or a metal, an optional encapsulant 9 or adhesive of a material such as ethyl vinyl acetate (EVA), polyvinyl butyral (PVB), or the like, and an optional rear substrate 11 of a material such as glass or the like. The semiconductor layer(s) of film 5 may be of or include one or more of a-Si, CdTe, CdS, or another other suitable material, in different example embodiments of this invention. Of course, other layer(s) which are not shown may be provided in the device, such as between the front glass substrate 1 and the front electrode 3, or between other layers of the device.

The ceramic target(s) used in sputter-depositing electrode/coating 3 may be of any suitable type in certain example embodiments of this invention. For example, rotating magnetron type targets or stationary planar targets may be used in certain example instances.

In certain example embodiments, the TCO electrode 3 of one or more layers may have a sheet resistance ($R_s$) of from about 7-50 ohms/square, more preferably from about 10-25 ohms/square, and most preferably from about 10-15 ohms/square using a reference example non-limiting thickness of from about 1,000 to 2,000 angstroms. These sheet resistance values apply before and/or after any optional heat treatment or high temperature processing.

Sputter deposition of TCO coating/electrode 3 at approximately room temperature on (directly or indirectly) substrate 1 would be desirable in certain example embodiments, given that most float glass manufacturing platforms are not equipped with in-situ heating systems. Moreover, an additional potential advantage of sputter-deposited TCO films is that they may include the integration of anti-reflection coatings (not shown), resistivity reduction, and so forth. For example, a single or multi-layer anti-reflection coating (not shown) may be provided between the glass substrate 1 and the TCO front electrode 3 in photovoltaic applications in certain example instances.

In certain example embodiments, the substantially transparent electrode 3 has a visible transmission of at least about 50%, more preferably of at least about 60%, even more preferably of at least about 70% or 80%. In certain example embodiments of this invention, the TCO front electrode or contact 3 is substantially free, or entirely free, of fluorine. This may be advantageous in certain example instances for pollutant issues.

An additional potential advantage of sputter-deposited TCO films for front electrodes/contacts 3 is that they may permit the integration of an anti-reflection and/or color-compression coating (not shown) between the front electrode 3 and the glass substrate 1. The anti-reflection coating (not shown) may include one or multiple layers in different embodiments of this invention. For example, the anti-reflection coating (not shown) may include a high refractive index dielectric layer immediately adjacent the glass substrate 1 and another layer of a lower refractive index dielectric immediately adjacent the front electrode 3. Thus, since the front electrode 3 is on the glass substrate 1, it will be appreciated that the word "on" as used herein covers both directly on and indirectly on with other layers therebetween.

Front glass substrate 1 and/or rear substrate 11 may be made of soda-lime-silica based glass in certain example embodiments of this invention. While substrates 1, 11 may be of glass in certain example embodiments of this invention, other materials such as quartz or the like may instead be used. Like electrode 3, substrate 1 may or may not be patterned in different example embodiments of this invention. Moreover, rear substrate or superstrate 11 is optional in certain instances. Glass 1 and/or 11 may or may not be thermally tempered in different embodiments of this invention.

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. These amorphous silicon based layers of film 5 may be of hydrogenated amorphous silicon in certain instances, but may also be of or include hydrogenated amorphous silicon carbon or hydrogenated amorphous silicon germanium, or other suitable material(s) in certain example embodiments of this invention. It is possible for the active region 5 to be of a double-junction type in alternative embodiments of this invention.

Back contact, reflector and/or electrode 7 of the photovoltaic device may be of any suitable electrically conductive material. For example and without limitation, the optional back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). It is possible that the optional rear electrode 7 be sputter-deposited in the manner discussed above in connection with front electrode 3 in certain example instances. The TCO of the back electrode 7 may be of the single layer type or a multi-layer type in different instances. Moreover, the back electrode or contact 7 may include both a TCO portion and a metal portion in certain instances. For example, in an example multi-layer embodiment, the TCO portion of the back contact 7 may include a layer of a material such as indium zinc oxide (which may or may not be doped with silver, or the like), indium-tin-oxide (ITO), or the like closest to the active region 5, and another conductive and possibly reflective layer of a material such as silver, molybdenum, platinum, steel, iron, niobium, titanium, chromium, bismuth, antimony, or aluminum further from the active region 5 and closer to the substrate 11. The metal portion may be closer to substrate 11 compared to the TCO portion of the back contact/electrode 7.

The photovoltaic module may be encapsulated or partially covered with an encapsulating material such as encapsulant 9 in certain example embodiments. An example encapsulant or adhesive for layer 9 is EVA. However, other materials such as PVB, Tedlar type plastic, Nuvasil type plastic, Tefzel type plastic or the like may instead be used for layer 9 in different instances.

Figure 2:
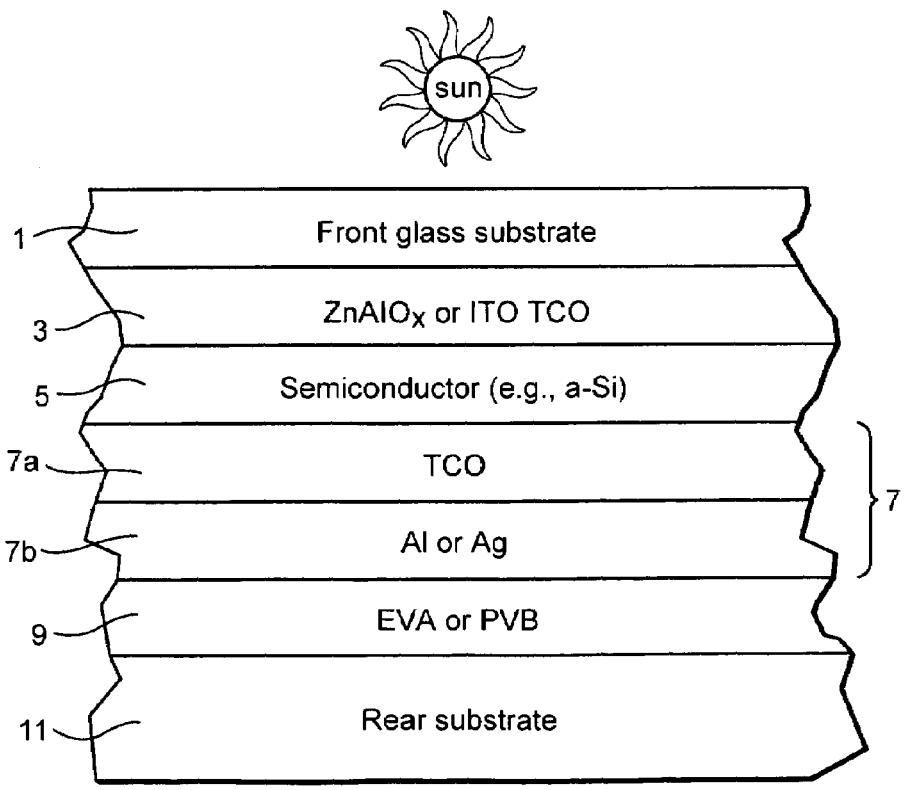
FIG. 2 is a cross-sectional view of an example photovoltaic device according to another example embodiment.

FIG. 2 is a cross sectional view of a photovoltaic device according to another example embodiment of this invention. The device of FIG. 2 is similar to that of FIG. 1, except that the rear electrode/reflector 7 is illustrated in FIG. 2 as including both a TCO portion 7a and a metal portion 7b. For example, in an example multi-layer embodiment, the TCO portion 7a of the back electrode 7 may include a layer 7a of a material such as indium zinc oxide (which may or may not be doped with silver, or the like), indium-tin-oxide (ITO), $ZnO_x$, tin oxide, or the like closest to the active region 5, and another conductive and possibly reflective layer 7b of a material such as silver, molybdenum, platinum, steel, iron, niobium, titanium, chromium, bismuth, antimony, or aluminum further from the active region 5 and closer to the substrate 11. Front electrode 3 in the FIG. 2 embodiment may be made in the same manner and/or of the same material(s) discussed above in connection with the FIG. 1 embodiment.

Figure 3:
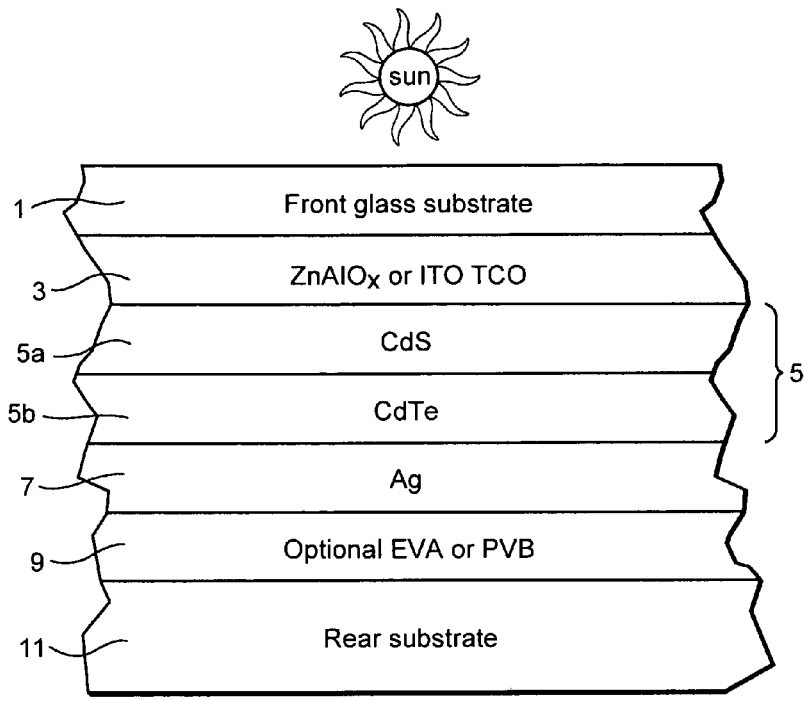
FIG. 3 is a cross-sectional view of an example photovoltaic device according to yet another example embodiment.

FIG. 3 is a cross sectional view of a CdTe type photovoltaic device according to another example embodiment of this invention. The device of FIG. 3, in this particular example, is similar to that of FIGS. 2-3 except that the semiconductor film 5 is shown as including both a CdS inclusive or based layer 5a and a CdTe inclusive or based layer 5b, and silver is used as an example material for the rear electrode or reflector 7 in this example. Front electrode 3 in the FIG. 3 embodiment may be made in the same manner and/or of the same material(s) discussed above in connection with the FIG. 1 embodiment.

As indicated above, it is known that lower sheet resistance in ITO films in comparison to its as-deposited counterpart typically requires activation. The activation, in turn, typically is achieved by baking in air in the temperature range of 300-350 degrees C. for 30-120 minutes. The inventors of the instant invention, however, have discovered that baking ITO films in a low oxygen environment such as a vacuum can further reduce the resistivity in comparison to air baked samples. Surprisingly and unexpectedly, the reduction in resistivity has been as much as 40% in certain example embodiments. Additionally, samples baked in a low oxygen environment such as a vacuum also surprisingly and unexpectedly have shown enhanced reflection in the infrared (IR) spectrum (e.g., wavelengths beyond 1400 nm, for example) as opposed to those samples baked in air. As is known, this is a desirable property for solar cell, low emissivity, and other applications. Correspondingly, ITO films baked in a vacuum or other low oxygen environment are less absorbing in the visible (e.g., wavelengths of 400-700 nm) and near infrared (NIR) (e.g., wavelengths of 700-1400 nm) spectra and accordingly will provide for higher transmission in these spectra than similar films baked in air.

The "optimal" temperature at which vacuum or low oxygen baked samples are baked, at least in terms of reducing sheet resistivity, has been found to be higher than 425 degrees C., more preferably higher than 450 degrees C., still more preferably higher than 475 degrees C., and most preferably higher than 500 degrees C. It thus will be appreciated that this temperature for baking in a low oxygen environment such as a vacuum is elevated beyond the conventional baking temperature range, which typically is 300-350 degrees C. Advantageously, the elevated temperature used in connection with certain example embodiments corresponds to the process temperature involved in the deposition of cadmium/telluride (CdTe) semiconductor layers used, for example, in the fabrication of solar cells.

The improved activation process of certain example embodiments may be said to be "irreversible" and has been determined by the inventors of the instant application to depend on time and temperature. In particular, resistivity has been found to decrease rapidly within the first 10 minutes of baking and has been found to be somewhat further reduced after 30-60 minutes. The reduction in resistivity has been found to remain generally stable when exposed to a heat source over time scales of up to about 60-120 minutes. Thus, it will be appreciated that certain example embodiments may be activated quite quickly, e.g., in comparison to conventional activation processes that typically take place for 30-120 minutes. In certain example embodiments, the activation time preferably is no more than 60 minutes, in certain example instances is no more than 45 minutes, and in yet further example instances is no more than 30 minutes. The quick activation of the film's desired conductive and optical properties after baking in a low oxygen or vacuum environment in accordance with certain example embodiments makes the implementation of this process in production coaters possible. For example, the same apparatus used to deposit CdTe layers may be used to activate the ITO since the same or similar temperature thresholds may be used for both applications. Furthermore, the lower resistivity enables lower film thicknesses to be used to achieve a desired sheet resistance, which typically translates to lower production costs.

Figure 4:
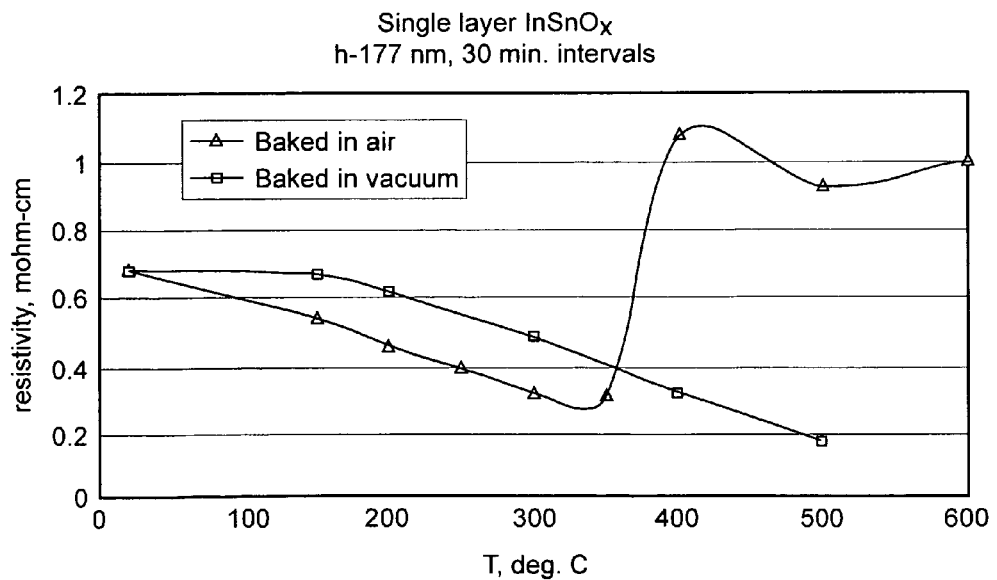
FIG. 4 shows single layer ITO resistivity vs. temperature for air and low oxygen baking environments according to certain example embodiments.

In view of the above, it will be appreciated that the low oxygen or vacuum baked ITO samples according to certain example embodiments may provide certain illustrative examples of conventional air baked samples. For example, it will be appreciated that the low oxygen or vacuum baked ITO samples according to certain example embodiments may provide for a greater reduction in sheet resistivity. The results of the dependence of sheet resistivity with baking temperature in air and low oxygen or vacuum are shown in FIG. 4 for similar as-deposited samples. In particular, FIG. 4 shows single layer ITO resistivity vs. temperature for air and low oxygen baking environments according to certain example embodiments. The FIG. 4 samples involve a total ITO layer thickness of about 177 nm. The minimum value of resistivity after baking the same sample at 30 minute intervals is 0.308 mΩ-cm and 0.175 mΩ-cm at temperatures of 300 degrees C. and 500 degrees C. in air and low oxygen or vacuum environments, respectively. These temperatures (300 degrees C. for the air-baked sample and 500 degrees C. for the low oxygen or vacuum baked sample) are referred to herein as "optimal" temperatures because they reduce resistivity to their minimum values. However, it will be appreciated that such temperatures may not always be "optimal" in the sense that other factors such as, for example, reflectivity, transmission, ease of use, cost, etc., may make other temperatures more or less advantageous than these examples. Accordingly, reference to "optimal" values herein should be not be construed as limiting of the invention; rather, reference to "optimal" values herein should be construed as relating to an example minimized sheet resistance for the particular samples shown in FIG. 4.

As will be appreciated from the FIG. 4 graph, although the resistivity for the air baked sample initially decreases with increased temperature, the resistivity for the air baked sample jumps significantly after a temperature of about 350 degrees C. By contrast, the resistivity of the sample baked in the vacuum continues to decrease up to and past a temperature of 500 degrees C. Although baking at lower temperatures results in better resistivity for the in-air samples, baking at temperatures higher than about 350 degrees C. results in better resistivity for the low oxygen or vacuum samples. Additionally, as indicated above, the lowest plotted resistivity was lower for the low oxygen or vacuum samples than the in-air samples. The target resistivity for the low oxygen or vacuum baked samples at its "optimal" temperature is preferably at least about 25% lower than the target resistivity for the air-baked sample at its "optimal" temperature, more preferably at least about 30% lower than the target resistivity for the air-baked sample at its "optimal" temperature, still more preferably at least about 35% lower than the target resistivity for the air-baked sample at its "optimal" temperature, and sometimes even 40% or more lower than the target resistivity for the air-baked sample at its "optimal" temperature. Indeed, the FIG. 4 example shows the resistivity for the low oxygen or vacuum baked samples at its "optimal" temperature being about 43% lower than the resistivity for the air-baked sample at its "optimal" temperature.

Figure 5:
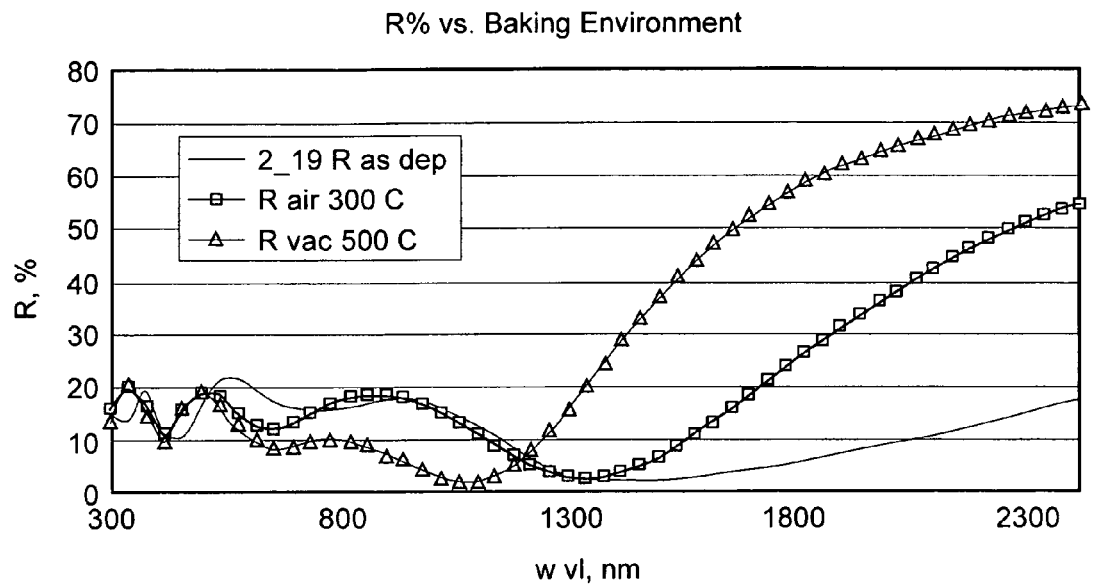
FIG. 5 is a comparison of reflectivity of as-deposited ITO samples after baking in various environments at their respective "optimal" temperatures.

As another example advantage, it will be appreciated that the low oxygen or vacuum baked ITO samples according to certain example embodiments may provide for higher reflectivity in the infrared spectrum. FIG. 5 compares the reflectivity of initially identical as-deposited samples after baking in air and in low oxygen or vacuum environments at their respective "optimal" temperatures. It will be appreciated from FIG. 5 that the sample baked in the low oxygen or vacuum environment has a much higher reflectivity in the infrared spectrum in comparison to the air-baked sample. In particular, the sample baked in the low oxygen or vacuum environment has a reflectivity that, on average, is about 20% points higher than the reflectivity for the air-baked sample at wavelengths at or beyond about 1400 nm. Both activated samples have much higher infrared reflectivities in comparison to the non-activated reference sample.

Figure 6:
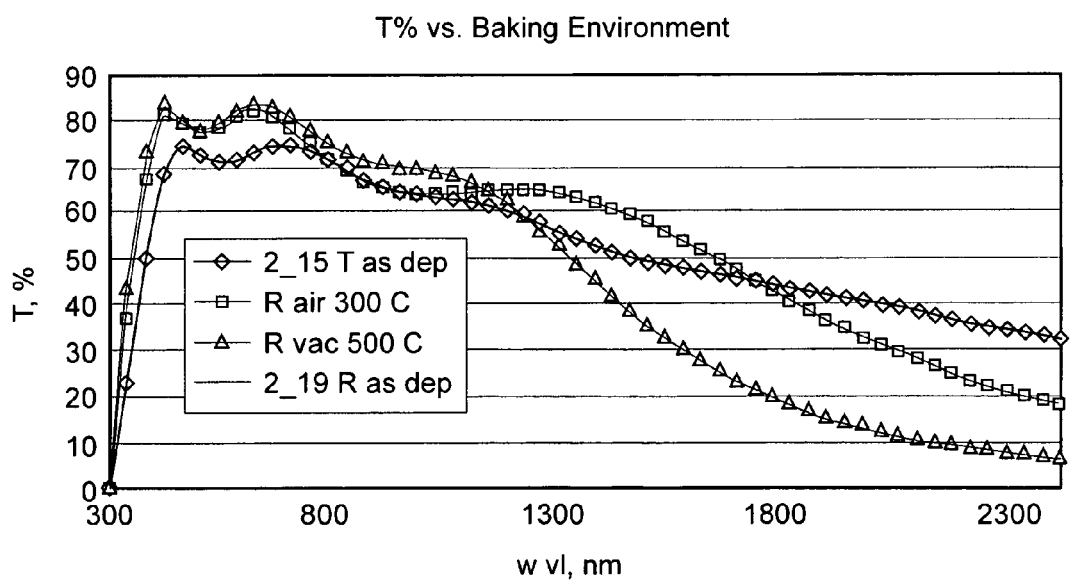
FIG. 6 is a comparison of transmission of as-deposited ITO samples after baking in various environments at their respective "optimal" temperatures.

As yet another example advantage, it will be appreciated that the low oxygen or vacuum baked ITO samples according to certain example embodiments may provide for reduced absorption, or higher transmission, in the visible spectrum (e.g., wavelengths of 400-700 nm). In this regard, FIG. 6 is a comparison of transmission of as-deposited ITO samples after baking in various environments at their respective "optimal" temperatures. As can be appreciated from FIG. 6, the low oxygen or vacuum baked ITO samples according to certain example embodiments have higher transmissions in the visible spectrum, and through a substantial portion (e.g., from 700 nm to about 1100 nm) of the near infrared (NIR) spectrum (e.g., wavelengths of 700-1400 nm).

As indicated above, the improved activation process of certain example embodiments may be said to be "irreversible." The "irreversibility" of certain example embodiments refers to the inventors' discovery that the ITO generally maintains a resistivity, $\rho_o$, associated with the greatest temperature that the sample has been exposed to, $T_o$. Accordingly, if the sample is subsequently baked at a temperature $T<T_o$, then $\rho_o=\rho(T)$ independent of the baking environment (e.g., air or vacuum).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of activating an indium tin oxide (ITO) thin film deposited, directly or indirectly, on a substrate, the method comprising:

baking the ITO thin film in a low oxygen environment containing oxygen at a temperature of at least 450 degrees C. for at least about 30 minutes so as to provide for (1) a post-baked resistivity of the ITO thin film that is below a resistivity of a corresponding air-baked ITO thin film, (2) a post-baked visible spectrum absorption and transmission of the ITO thin film that respectively are below and above the absorption and transmission of the corresponding air-baked ITO thin film, and (3) a post-baked infrared reflectivity of the ITO thin film that is above the reflectivity of the corresponding air-baked ITO thin film, and wherein the post-baked resistivity of the ITO film from about $1.75 \times 10^{-4}$ to $2 \times 10^{-4}$ ohm-cm.

2. The method of claim 1, wherein the low oxygen environment is a vacuum.

3. The method of claim 1, wherein the ITO thin film is baked at a temperature of at least 475 degrees C.

4. The method of claim 1, wherein the ITO thin film is baked at a temperature of at least 500 degrees C.

5. The method of claim 1, wherein the ITO thin film is baked for less than 45 minutes.

6. The method of claim 1, wherein the ITO thin film is baked for no more than 30 minutes.

7. The method of claim 1, wherein the post-baked ITO thin film exhibits increased infrared reflectivity for wavelengths at and beyond wavelengths of 1400 nm.

8. The method of claim 1, wherein the post-baked resistivity of the ITO thin film is at least 25% below the resistivity of the corresponding air-baked ITO thin film.

9. The method of claim 1, wherein the post-baked infrared reflectivity of the ITO thin film is at least 20% points above the reflectivity of the corresponding air-baked ITO thin film for infrared wavelengths at or beyond 1400 nm.

10. A method of making a photovoltaic device, the method comprising:
provide a substantially transparent substrate;
disposing a layer comprising indium tin oxide (ITO), directly or indirectly, on the substrate; and
heating the layer comprising ITO in a low oxygen environment containing oxygen to a temperature of at least 475 degrees C. for at least 10 minutes so as to provide for (1) a post-baked sheet resistance of the layer comprising ITO that is below a sheet resistance of a corresponding air-baked ITO thin film, (2) a post-baked visible spectrum absorption and transmission of the layer comprising ITO that respectively are below and above the absorption and transmission of the corresponding air-baked ITO thin film, and (3) a post-baked infrared reflectivity of the layer comprising ITO that is above the reflectivity of the corresponding air-baked ITO thin film, such that the infrared reflectivity of the layer comprising ITO in the photovoltaic device is at least 20% points above the reflectivity of a corresponding air-baked ITO thin film in a corresponding photovoltaic device for infrared wavelengths at or beyond 1400 nm.

11. The method of claim 10, wherein the low oxygen environment is a vacuum.

12. The method of claim 10, wherein the layer comprising ITO is heated to a temperature of at least 500 degrees C.

13. The method of claim 10, wherein the layer comprising ITO is heated for no more than 60 minutes.

14. The method of claim 10, wherein the sheet resistance of the layer comprising ITO in the photovoltaic device is at least 25% below a sheet resistance of a corresponding air-baked ITO thin film in a corresponding photovoltaic device.

15. The method of claim 10, wherein the photovoltaic device is a front electrode photovoltaic device.

16. The method of claim 10, wherein the photovoltaic device is a back electrode photovoltaic device.

17. The method of claim 10, wherein the photovoltaic device is a CdTe photovoltaic device.

18. The method of claim 17, further comprising activating the layer comprising ITO as the CdTe is being formed.

19. A method of making an electronic device, the method comprising:
providing a substrate having a layer comprising indium tin oxide (ITO) formed, directly or indirectly, thereon;
heating the layer comprising ITO in a low oxygen environment containing oxygen to a temperature of at least 475 degrees C. for from about 30 to 60 minutes to activate the layer comprising ITO, such that the layer comprising ITO has a sheet resistance lower than a sheet resistance of a corresponding layer comprising ITO activated in air-inclusive environment at a temperature no greater than 350 degrees C., such that a resistivity of the layer is from about $1.75 \times 10^{-4}$ to $2 \times 10^{-4}$ ohm-cm, and wherein the infrared reflectivity of the layer comprising ITO in the electronic device is at least 20% points above the reflectivity of a corresponding air-baked ITO thin film in a corresponding photovoltaic device for infrared wavelengths at or beyond 1400 nm; and
building the substrate into the electronic device.

* * * * *